(12) United States Patent
Takubo et al.

(10) Patent No.: US 11,578,266 B2
(45) Date of Patent: Feb. 14, 2023

(54) SILYL PHOSPHINE COMPOUND, PROCESS FOR PRODUCING SILYL PHOSPHINE COMPOUND AND PROCESS FOR PRODUCING INP QUANTUM DOTS

(71) Applicant: Nippon Chemical Industrial Co., Ltd., Tokyo (JP)

(72) Inventors: Yosuke Takubo, Tokyo (JP); Ken Tamura, Tokyo (JP); Kazuhiro Nakatsui, Tokyo (JP)

(73) Assignee: NIPPON CHEMICAL INDUSTRIAL CO., LTD., Tokyo (JP)

( * ) Notice: Subject to any disclaimer, the term of this patent is extended or adjusted under 35 U.S.C. 154(b) by 0 days.

(21) Appl. No.: 16/979,340

(22) PCT Filed: Mar. 20, 2019

(86) PCT No.: PCT/JP2019/011760
§ 371 (c)(1),
(2) Date: Sep. 9, 2020

(87) PCT Pub. No.: WO2019/188680
PCT Pub. Date: Oct. 3, 2019

(65) Prior Publication Data
US 2021/0002548 A1 Jan. 7, 2021

(30) Foreign Application Priority Data
Mar. 27, 2018 (JP) .............................. JP2018-060922

(51) Int. Cl.
*C07F 9/06* (2006.01)
*C07F 7/08* (2006.01)
*C07F 9/50* (2006.01)
*C09K 11/70* (2006.01)
*C01B 25/08* (2006.01)

(52) U.S. Cl.
CPC ............ *C09K 11/70* (2013.01); *C01B 25/087* (2013.01); *C07F 7/08* (2013.01); *C07F 9/06* (2013.01); *C07F 9/5009* (2013.01)

(58) Field of Classification Search
None
See application file for complete search history.

(56) References Cited

U.S. PATENT DOCUMENTS

| | | | |
|---|---|---|---|
| 2017/0037314 A1 | 2/2017 | Nam et al. | |
| 2017/0226138 A1* | 8/2017 | Shin ................. | C07F 9/062 |
| 2018/0327664 A1 | 11/2018 | Houtepen et al. | |
| 2019/0112527 A1 | 4/2019 | Moriyama et al. | |

FOREIGN PATENT DOCUMENTS

| | | |
|---|---|---|
| DE | 274 626 A1 | 12/1989 |
| JP | 59-45913 A | 3/1984 |
| JP | 63-017211 | * 11/1988 |
| JP | 2017-538662 A | 12/2017 |
| TW | 201807161 A | 3/2018 |
| WO | 2017/074897 A1 | 5/2017 |

OTHER PUBLICATIONS

Kim et al. "Engineering InAsxP1–x/InP/ZnSe III-V Alloyed Core/Shell Quantum Dots for the Near-Infrared" Journal of the American Chemical Society, 2005, vol. 127, No. 30, pp. 10526-10532.*
Uhlig et al., "A New and Convenient Synthesis of Organosilylphosphines", Z. anorg. allg. Chem., 1989, vol. 576, pp. 281-283, cited in Specification and ISR, w/English abstract (3 pages).
Bruckmann et al., "Tris(n-butyl)phosphine, Tris(tertbutyl)phosphine and Tris(trimethylsilyl) phosphine", Acta Crystallographica Section C, 1995, vol. C51, pp. 1152-1155, cited in Specification (4 pages).
Parshall et al., "Synthesis of Alkylsilylphosphines", J. Am. Chem. Soc., 1959, vol. 81 (23), pp. 6273-6275, cited in Specification (3 pages).
International Search Report dated Jun. 25, 2019, issued in counterpart International Application No. PCT/JP2019/011760 (2 pages).

* cited by examiner

*Primary Examiner* — Joseph R Kosack
(74) *Attorney, Agent, or Firm* — WHDA, LLP

(57) ABSTRACT

The silyl phosphine compound of the present invention is represented by the formula (1) and has an arsenic content of not more than 1 ppm. The process for producing a silyl phosphine compound of the present invention is a process comprising mixing a basic compound, a silylating agent and phosphine to obtain a solution containing a silyl phosphine compound, removing a solvent from the solution to obtain a concentrated solution of a silyl phosphine compound, and distilling the concentrated solution, wherein an arsenic content in the phosphine is adjusted to not more than 1 ppm by volume in terms of arsine. The process for producing InP quantum dots of the present invention uses, as a phosphorus source, a silyl phosphine compound represented by the formula (1) and having an arsenic content of not more than 1 ppm by mass.

(1)

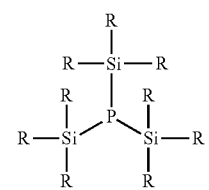

(For definition of R, see the specification.)

8 Claims, No Drawings

SILYL PHOSPHINE COMPOUND, PROCESS FOR PRODUCING SILYL PHOSPHINE COMPOUND AND PROCESS FOR PRODUCING INP QUANTUM DOTS

TECHNICAL FIELD

The present invention relates to a process for producing a silyl phosphine compound that is useful as a phosphorus component raw material of indium phosphide quantum dots.

BACKGROUND ART

In recent years, development of quantum dots as luminescent materials has been under way. Development of cadmium-based quantum dots such as CdSe, CdTe and CdS that are typical quantum dots has been promoted from their excellent optical properties, etc. However, since toxicity and environmental burden of cadmium are high, development of cadmium-free quantum dots is being expected.

One of the cadmium-free quantum dots is, for example, indium phosphide (InP). In the production of indium phosphide, a silyl phosphine compound such as tris(trimethylsilyl)phosphine is often used as a phosphorus component raw material. Since the silyl phosphine compound such as tris(trimethylsilyl)phosphine can be used in a solid state or in a stake of a liquid phase in which the compound is dissolved in a solvent, it is also used as a phosphorus source of organic synthesis in circumstances where a gaseous phosphorus source (phosphine or the like) cannot be used. As production processes for a silyl phosphine compound such as tris(trimethylsilyl)phosphine, a few processes have been proposed (e.g., Patent Literature 1 and Non Patent Literatures 1 to 3).

Of the production processes for a silyl phosphine compound, the production processes using phosphine, a silylating agent such as trimethylsilyl triflate and a basic compound, which are described in Patent Literature 1 and Non Patent Literature 1, are thought to be particularly useful for carrying out industrial production from the viewpoints of reaction rate, purity of the product, etc.

In Patent Literature 2, use of phosphine as a semiconductor raw material and a method for reducing an amount of arsenic in phosphine are described.

CITATION LIST

Patent Literature

Patent Literature 1: DD274626A1
Patent Literature 2: Japanese Patent Laid-Open No. 59-45913

Non Patent Literature

Non Patent Literature 1: Z. anorg. Allg. Chem. 576 (1989) 281-283
Non Patent Literature 2: Acta Crystallographica Section C, (1995), C51, 1152-1155
Non Patent Literature 3: J. Am. Chem. Soc., 1959, 81 (23) 6273-6275

SUMMARY OF INVENTION

Technical Problem

However, the production processes for a silyl phosphine compound described in Patent Literature 1 and Non Patent Literature 1 have problems with purity and yield, and in addition, there is the following problem: even if InP quantum dots are produced using the resulting silyl phosphine compound, the quantum yield of the quantum dots is low.

In Patent Literature 2, a silyl phosphine compound and quantum dots obtained by using the same are not described at all, and their problems have not been studied at all.

Accordingly, it is an object of the present invention to provide a silyl phosphine compound capable of solving the problems of the prior art, a process for producing a silyl phosphine compound by which the above silyl phosphine compound is obtained, and a process for producing InP quantum dots using the above silyl phosphine compound.

In order to solve the above problems, the present inventors have earnestly studied, and as a result, they have surprisingly found that by using, as a raw material of InP quantum dots, a silyl phosphine compound having been reduced in the amount of arsenic, the quantum yield of the resulting InP quantum dots can be enhanced, and by reducing the amount of arsenic in phosphine in the production process using phosphine, a silylating agent and a basic compound, a high-purity silyl phosphine compound containing a small amount of arsenic and preferable as a raw material of InP quantum dots is obtained, and they have achieved the present invention.

That, is to say, the present invention provides a silyl phosphine compound represented by the following formula (1), wherein an arsenic content is not more than 1 ppm by mass,

[Formula 1]

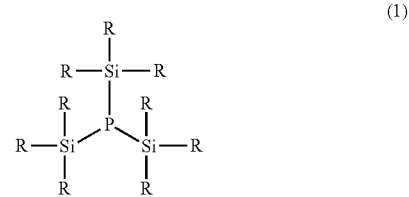

wherein each R is independently an alkyl group having not less than 1 and not more than 5 carbon atoms or an aryl group having not less than 6 and not more than 10 carbon atoms.

Further, the present invention provides a process for producing the above silyl phosphine compound, comprising:
a first step of mixing a basic compound, a silylating agent represented by the following formula (I) and phosphine to obtain a solution containing a silyl phosphine compound;
a second step of removing a solvent from the solution containing a silyl phosphine compound to obtain a concentrated solution of a silyl phosphine compound; and
a third step of distilling the concentrated solution of a silyl phosphine compound to obtain the silyl phosphine compound; wherein as the phosphine, phosphine having an arsenic content of not more than 1 ppm by volume in terms of arsine is used.

In addition, the present invention provides a process for producing InP quantum dots from a phosphorus source and an indium source, wherein as the phosphorus source, a silyl phosphine compound represented by the aforesaid formula (1) and having an arsenic content of not more than 1 ppm by mass is used.

DESCRIPTION OF EMBODIMENTS

A preferred embodiment of the silyl phosphine compound of the present invention is described hereinafter. The silyl phosphine compound of the present invention is a tertiary compound, namely a compound in which three silyl groups are bonded to a phosphorus atom, and is preferably a compound represented by the following formula (1).

[Formula 2]

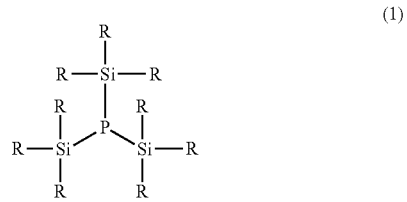

(1)

wherein each R is independently an alkyl group having not less than 1 and not more than 5 carbon atoms or an aryl group having not less than 6 and not more than 10 carbon atoms.

Examples of the alkyl groups having not less than 1 and not more than 5 carbon atoms, the alkyl groups each being represented by R, include methyl group, ethyl group n-propyl group, isopropyl group, n-butyl group, sec-butyl group, tert-butyl group, isobutyl group, n-amyl group, isoamyl group and tert-amyl group.

Examples of the aryl groups having not less than 6 and not more than 10 carbon atoms, the aryl groups each being represented by R, include phenyl group, tolyl group ethylphenyl group, propylphenyl group, isopropylphenyl group, butylphenyl group, sec-butylphenyl group, tert-butylphenyl group, isobutylphenyl group, methylethylphenyl group and trimethylphenyl group.

These alkyl groups and aryl groups may each have one or two or more substituents, and examples of the substituents of the alkyl groups include hydroxyl group, halogen atoms, cyano group and amino group, and examples of the substituents of the aryl groups include alkyl groups having not less than 1 and not more than 5 carbon atoms, alkoxy groups having not less than 1 and not more than 5 carbon atoms, hydroxyl group, halogen atoms, cyano group and amino group. When the aryl group is substituted by an alkyl group or an alkoxy group, the number of carbon atoms of the alkyl group or the alkoxy group is included in the number of carbon atoms of the aryl group.

A plurality of R in the formula (1) may be the same as or different from one another (the same shall apply to each of the formula (I) and the formulas (2) to (7) described later). Furthermore, three silyl groups (—$SiR_3$) present in the formula (1) may also be the same as or different from one another. As the silyl phosphine compound represented by the formula (1), a compound wherein R is an alkyl group having not less than 1 and not more than 4 carbon atoms or a phenyl group that is unsubstituted or substituted by an alkyl group having not less than 1 and not more than 4 carbon atoms is preferable because it is excellent in reactivity with other molecules, as a phosphorus source in the synthesis reaction, and a trimethylsilyl group is particularly preferable.

The silyl phosphine compound of the formula (1) is one in which the arsenic content is low. The present inventor has earnestly studied a method for enhancing a quantum yield of InP quantum dots obtained by using the silyl phosphine compound of the formula (1) as a raw material. As a result, the present inventor has found that by decreasing the amount of arsenic in the silyl phosphine compound, an evil influence that the properties of organic synthetic products or quantum dots produced using this as a raw material are impaired can be effectively prevented, and particularly a quantum yield of InP quantum dots can be enhanced.

The arsenic content in the silyl phosphine compound of the formula (1) is not more than 1 ppm by mass, more preferably not more than 0.8 ppm by mass, and particularly preferably not more than 0.5 ppm by mass. In order to reduce the arsenic content to not more than the upper limit, the silyl phosphine compound only needs to be produced by a preferred production process described later.

The arsenic content in the silyl phosphine compound of the formula (1) is measured by an ICP-MS calibration curve analysis method, and can be specifically measured by the method described in the Examples described later.

The silyl phosphine compound of the formula (1) having an arsenic content of not more than the above upper limit is preferably used for producing indium phosphide (InP). InP is also referred to as indium(III) phosphide, and is a compound semiconductor. Moreover, the silyl phosphine compound of the formula (1) is preferably used as a raw material of InP quantum dots. The InP quantum dots refer to semiconductor nanoparticles each containing In and P and having a quantum confinement effect. The quantum confinement effect means that when the size of a substance becomes about a Bohr radius, an electron therein cannot freely move, and in such a state, the energy of the electron can only have not an arbitrary value but a specific value. The particle diameters of the quantum dots (semiconductor nanoparticles) are generally in the range of several nm to several tens of nm. InP in the InP quantum dots means that In and P are contained, but does not mean that an In:P mole ratio of 1:1 is necessary. Utilizing the quantum confinement, effect, the InP quantum dots are expected to be applied to a single-electron transistor, teleportation, laser, a solar cell, a quantum computer, etc. Also, use of the InP quantum dots as a fluorescent substance has been proposed, and application to a biomarker, a light-emitting diode, etc. has been proposed. The quantum yield is determined by φ=the number of photons released/the number of photons absorbed, as conversion efficiency of excitation light and fluorescence relating to the InP quantum dots. When the InP quantum dots are quantum dots formed of In and P, the maximum absorption wavelength in UV-VIS is preferably 450 to 550 nm, and more preferably 460 to 540 nm. The amount of In and the amount of P in a sample liquid in the UV-VIS measurement are each preferably in the range of 0.01 mmol to 1 mmol, more preferably 0.02 mmol to 0.3 mmol, in terms of a phosphorus atom or an indium atom, per 100 g of the sample liquid.

The InP quantum dots may be quantum dots formed of a composite compound having, in addition to In and P, an element M other than phosphorus and indium (also referred to as composite quantum dots).

The element M is preferably at least one selected from the group consisting of Be, Mg, Zn, B, Al, Ga, S, Se and B, from the viewpoint of enhancement of quantum yield. Typical examples of the InP quantum dots containing an element M include InGaP, InZnP, InAlP, InGaAlP and InNP.

The InP quantum dots may be each a mixture of In and P, or InMP containing the element M in addition thereto, and another semiconductor compound. Such a semiconductor compound is preferably a group III-group V semiconductor that is the same as InP, from the viewpoint of enhancement of quantum yield, and specific examples thereof include GaP, AlP, GaAs, AlN, AlAs, InN, BP, GaN, GaSb and InAs.

The InP quantum dots may each have a core-shell structure in which the InP quantum dot material is used as a core and the core is coated with a coating compound. Examples of the coating compounds include ZnS, ZnSe, ZnTe GaP and GaN. In the present invention, InP quantum dots having such a core-shell structure are also included in the InP quantum dots.

In the silyl phosphine compound of the present invention, the content of the compound represented by the formula (1) is more preferably not less than 99.3 mol %, and particularly preferably not less than 99.5 mol %. The amount of the compound represented by the formula (1) can be measured by, for example, the method described in the Examples described later using the analysis based on $^{31}$P-NMR.

In the silyl phosphine compound of the present invention, it is preferable that the amount of at least one of compounds represented by the formulas (2) to (7) that are impurities be small, and it is more preferable that the amounts of all of them be small, from the viewpoint of making the particle diameter distribution of the resulting quantum dots sharp. Specifically, in the silyl phosphine compound of the present invention, the content of the compound represented by the formula (2) is more preferably not more than 0.3 mol %, and still more preferably not more than 0.2 mol %.

[Formula 3]

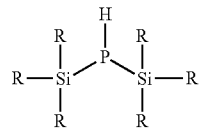

(2)

wherein R is the same as in the formula (1).

In the silyl phosphine compound of the present invention, the content of the compound represented by the formula (3) is preferably not more than 0.1 mol %, more preferably not more than 0.08 mol %, and particularly preferably not more than 0.05 mol %.

[Formula 4]

(3)

wherein R is the same as in the formula (1).

In the silyl phosphine compound of the present invention, the content of the ether compound represented by the formula (4) is preferably not more than 0.50 mol %, more preferably not more than 0.30 mol %, and still more preferably not more than 0.15 mol %.

[Formula 5]

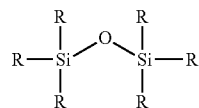

(4)

wherein R is the same as in the formula (1).

In the silyl phosphine compound of the present invention, the content of the compound represented by the formula (5) is preferably not more than 0.30 mol %, more preferably not more than 0.15 mol %, and particularly preferably not more than 0.05 mol %.

[Formula 6]

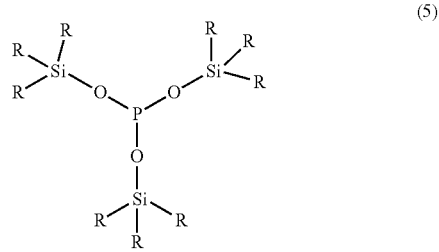

(5)

wherein R is the same as in the formula (1).

In the silyl phosphine compound of the present invention, the content of the compound represented by the formula (6) is preferably not more than 0.30 mol %, more preferably not more than 0.15 mol %, and particularly preferably not more than 0.05 mol %.

[Formula 7]

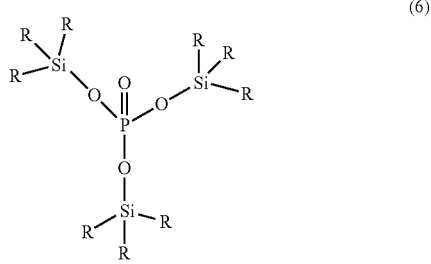

(6)

wherein R is the same as in the formula (1).

In the silyl phosphine compound of the present invention, the content of the compound represented by the formula (7) is preferably not more than 1.0 mol %, more preferably not more than 0.5 mol %, and particularly preferably not more than 0.2 mol %.

[Formula 8]

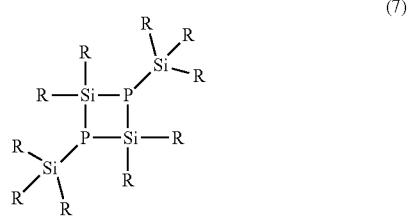

(7)

wherein R is the same as in the formula (1).

When the silyl phosphine compound in which the contents of one or two or more or all of the compounds represented by the formulas (2) to (7) are not more than the above upper limits is used as a raw material for organic synthesis or the like, a high-quality product is obtained. Particularly when it is used for synthesis of quantum clots, particle formation becomes good. The contents of the compounds represented by the formulas (2) to (7) are each a ratio to the compound represented by the formula (1).

In order to reduce the content of the compound represented by the formula (2) to not more than the aforesaid upper limit, a preferred production process for the compound represented by the formula (1), which is described later, only needs to be adopted, and in this production process, a solvent having a specific relative dielectric constant only needs to be used as the solvent, or the quantitative ratio between the silylating agent and phosphine only needs to be controlled. The content of the compound represented by the formula (2) can be measured by, for example, the method described in the Examples described later using the analysis based on $^{31}$P-NMR.

In order to reduce the content of the compound represented by the formula (3) to not more than the aforesaid upper limit, a preferred production process for the compound represented by the formula (1), which is described later, only needs to be adopted, and in this production process, a solvent having a specific relative dielectric constant only needs to be used as the solvent, or the quantitative ratio between the silylating agent and phosphine only needs to be controlled. The content of the compound represented by the formula (3) can be measured by, for example, the method described in the Examples described later using the analysis based on $^{31}$P-NMR.

In order to reduce the content of the compound represented by the formula (4) to not more than the aforesaid upper limit, a preferred production process for the compound represented by the formula (1), which is described later, only needs to be adopted, and in this production process, a solvent having a specific relative dielectric constant only needs to be used as the solvent. The content of the compound represented by the formula (4) can be measured by, for example, the method described in the Examples described later using the analysis based on gas chromatography.

In order to reduce the content of the compound represented by the formula (5) to not more than the aforesaid upper limit, a preferred production process for the compound represented by the formula (1), which is described later, only needs to be adopted, and in this production process, the first step to the third step only need to be carried out in an inert atmosphere. The content of the compound represented by the formula (5) can be measured by, for example, the method described in the Examples described later using the analysis based on $^{31}$P-NMR.

In order to reduce the content of the compound represented by the formula (6) to not more than the aforesaid upper limit, a preferred production process for the compound represented by the formula (1), which is described later, only needs to be adopted, and in this production process, the first step to the third step only need to be carried out in an inert atmosphere. The content of the compound represented by the formula (6) can be measured by, for example, the method described in the Examples described later using the analysis based on $^{31}$P-NMR.

In order to reduce the content of the compound represented by the formula (7) to not more than the aforesaid upper limit, a preferred production process for the compound represented by the formula (1), which is described later, only needs to be adopted, and in this production process, a high-boiling component only needs to be separated. The content of the compound represented by the formula (7) can be measured by, for example, the method described in the Examples described later using the analysis based on $^{31}$P-NMR.

The above-described arsenic content is applicable to the case where the silyl phosphine compound is present in the form of a solid such as a powder and also to the case where the silyl phosphine compound is present in the state of being dispersed in a solvent. That is to say, in the former case, the above-described arsenic content indicates a preferred amount in a solid such as a powder composed of the silyl phosphine compound, and in the latter case, the above-described preferred mole ratio indicates that of the arsenic content to the silyl phosphine compound in a dispersion in which the silyl phosphine compound is dispersed.

Similarly, the aforesaid amounts of the compounds represented by the formulas (2) to (7) are applicable to the case where the silyl phosphine compound is present in the form of a solid such as a powder and also to the case where the silyl phosphine compound is present in the state of being dispersed in a solvent. That is to say, in the former case, the aforesaid preferred mole ratios of the compounds represented by the formulas (2) to (7) mean mole ratios of the compounds represented by the formulas (2) to (7) to the compound of the formula (1) in a solid such as a powder composed of the silyl phosphine compound. In the latter case, the aforesaid preferred mole ratios mean mole ratios of the compounds represented by the formulas (2) to (7) to the compound of the formula (1) in a dispersion in which the silyl phosphine compound is dispersed.

Next, a process for producing a silyl phosphine compound, which is preferable for producing a silyl phosphine compound having a low arsenic content as described above, is described. The present inventor has found that by reducing the amount of arsenic in phosphine in a specific production process, a high-purity silyl phosphine compound having a low arsenic content and preferable as a raw material of quantum dots is obtained, and he has found the present production process.

The present production process is a process for producing a silyl phosphine compound, comprising:

a first step of mixing a basic compound, a silylating agent represented by the following formula (I) and phosphine (PH$_3$) to obtain a solution containing the aforesaid silyl phosphine compound;

a second step of removing a solvent from the solution containing the silyl phosphine compound to obtain a concentrated solution of the silyl phosphine compound; and a third step of distilling the concentrated solution of the silyl phosphine compound to obtain the silyl phosphine compound; wherein as the phosphine, phosphine having an arsenic content of not more than 1 ppm by volume in terms of arsine is used.

First, the first step is described.

First Step

In this step, a silylating agent, a basic compound, a solvent and phosphine are mixed to obtain a solution containing a silyl phosphine compound. In particular, it is preferable to mix a mixed solution containing a silylating agent, a basic compound and a solvent with phosphine to obtain a solution containing a silyl phosphine compound, from the viewpoints of ease of mixing of the components, workability and safety. Especially, it is more preferable to mix the mixed solution with phosphine to obtain a solution containing a silyl phosphine compound by introducing phosphine into the mixed solution.

The silylating agent is preferably, for example, a compound represented by the following formula (I) from the viewpoint of reactivity with phosphine.

[Formula 9]

wherein R is the same as in the formula (1), and X is at least one selected from a fluorosulfonic acid group, a fluoroalkanesulfonic acid group, an alkanesulfonic acid group and a perchloric acid group.

An example of the reaction of the present embodiment in the case where the silylating agent is a compound represented by the formula (I) is shown as the following reaction formula.

[Formula 10]

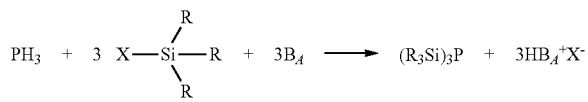

wherein R and X are the same as those in the formula (I), and $B_A$ is a monovalent base.

The fluorosulfonic acid group represented by X is also represented by "—$OSO_2F$". The fluoroalkanesulfonic acid group represented by X is, for example, a perfluoroalkanesulfonic acid group. Examples thereof include a trifluoromethanesulfonic acid group (—$OSO_2CF_3$), a pentafluoroethanesulfonic acid group (—$OSO_2C_2F_5$), a heptafluoropropanesulfonic acid group (—$OSO_2C_3F_7$), a nonafluorobutanesulfonic acid group (—$OSO_2C_4F_9$) and an undecafluoropentanesulfonic acid group (—$OSO_2C_5F_{11}$). Examples of the alkanesulfonic acid groups represented by X include a methanesulfonic acid group (—$OSO_2CH_3$), an ethanesulfonic acid group (—$OSO_2C_2H_5$), a propanesulfonic acid group (—$OSO_2C_3H_7$), a butanesulfonic acid group (—$OSO_2C_4H_9$) and a pentanesulfonic acid group (—$OSO_2C_5H_{11}$). The perchloric acid group represented by X is also represented by "—$OClO_3$". In these formulas, "—" represents a bonding hand.

The silylating agent is preferably one in which R is an alkyl group having not less than 1 and not more than 5 carbon atoms or a phenyl group that is unsubstituted or substituted by an alkyl group having not less than 1 and not more than 5 carbon atoms, from the viewpoint of excellent reactivity. Alternatively, a silylating agent wherein X is a perfluoroalkanesulfonic acid group, particularly a trifluoromethanesulfonic acid group, is also preferable because it is excellent in leaving properties from the silyl group. From these viewpoints, it is preferable to particularly use, as the silylating agent, one or two or more selected from trimethylsilyl trifluoromethanesulfonate, triethylsilyl trifluoromethanesulfonate, tributylsilyl trifluoromethanesulfonate, triisopropylsilyl trifluoromethanesulfonate, triphenylsilyl trifluoromethanesulfonate and tert-butyldimethylsilyl trifluoromethanesulfonate.

In addition to use of a specific solvent described later, it is preferable that the amount of the silylating agent in the mixed solution be a specific amount from the viewpoint that formation of impurities, particularly a secondary silyl phosphine compound such as the compound of the formula (2) or primary silyl phosphine that is the compound of the formula (3), is effectively suppressed. It is preferable that the ratio of the silylating agent to the phosphine introduced into the mixed solution be not less than the reaction equivalent, that is, not less than 3 times the molar amount of the phosphine, and it is more preferable that the ratio be more than 3 times, additionally not less than 3.01 times, particularly not less than 3.05 times, the molar amount of the phosphine. From the viewpoint that a residue of an excess silylating agent is reduced to enhance purity or the production cost is decreased, it is preferable that the amount of the silylating agent in the mixed solution be an amount of such a degree as is more than the reaction equivalent in the reaction with the phosphine but cannot be deemed to be excessive. From this viewpoint, the amount of the silylating agent in the mixed solution is preferably not more than 2 times the reaction equivalent based on the phosphine introduced into the mixed solution, that is, not more than 6 times, particularly preferably not more than 4 times, and most preferably not more than 3.5 times, the molar amount of the phosphine introduced into the mixed solution.

The basic compounds include not only a base in a narrow sense that gives a hydroxide ion when it is dissolved in water but also a base in a broad sense such as a substance that receives a proton or a substance that gives an electron pair. It is preferable that the basic compounds be particularly amines because a side reaction with phosphine can be suppressed. Examples of the amines include primary, secondary or tertiary alkylamines; anilines; toluidine; piperidine; and pyridines. Examples of the primary, secondary or tertiary alkylamines include methylamine, dimethylamine, trimethylamine, ethylamine, dieihylamine, triethylamine, propylamine, diisopropylamine, butylamine, isobutylamine, dibutylamine, tributylamine, pentylamine, dipentylamine, tripentylamine and 2-ethylhexylamine. Examples of the anilines include aniline, N-methylaniline, N,N-dimethylaniline and N,N-diethylaniline. Examples of the pyridines include pyridine and 2,6-di(t-butyl)pyridine. These can be used singly or in combinations of two or more.

It is preferable to use one or two or more selected particularly from methylamine, dimethylamine, trimethylamine, ethylamine, dimethylamine, triethylamine, ethylenediamine, aniline, toluidine, pyridine and piperidine among the above compounds because the reaction efficiently proceeds.

In addition to use of a specific solvent, it is preferable that the amount of the basic compound be a specific amount from the viewpoint that formation of impurities, particularly secondary or primary silyl phosphine, is effectively suppressed. For example, it is preferable that the ratio of the basic compound in the mixed solution to the phosphine introduced into the mixed solution be not less than the reaction equivalent, that is, when the basic compound is, for example, a monovalent base, it is preferable that the ratio be not less than 3 times the molar amount of the phosphine, and it is more preferable that the ratio be more than 3 times, additionally not less than 3.3 times, particularly not less than 3.5 times, the molar amount of the phosphine. From the viewpoint of enhancement in the purity of a desired product or decrease in the production cost, it is preferable that the amount of the basic compound in the mixed solution be a large amount of such a degree as does not become too excessive and preferably as cannot be deemed to be excessive. From this viewpoint, the amount of the basic compound in the mixed solution is preferably not more than 2 times the reaction equivalent based on the phosphine introduced into the mixed solution, and is preferably, for example, not more than 6 times, particularly preferably not more than 5 times, and most preferably not more than 4 times, the molar amount of the phosphine introduced into the mixed solution.

In the mixed solution, the number of moles of the basic compound is preferably not less than the number of moles of the silylating agent, and is preferably, for example, not less than 1.01 mol and not more than 2 mol, and more preferably not less than 1.05 mol and not more than 1.5 mol, per mol of the silylating agent.

Use of a solvent having a relative dielectric constant of not more than 4 as the solvent is preferable because hydrolysis of the desired silyl phosphine compound is suppressed, and formation of impurities represented by the formulas (2) to (4) can be suppressed.

The relative dielectric constant refers to a ratio of a dielectric constant of the substance to a dielectric constant of vacuum. In general, as the polarity of a solvent increases, the relative dielectric constant increases. As the relative dielectric constants of solvents in the present embodiment, values described in "Handbook of Chemistry: Pure Chemistry, 5th ed." (edited by the Chemical Society of Japan, published on Feb. 20, 2004, pp. II-620-II-622) can be used.

The solvent is preferably an organic solvent, and preferred examples thereof include hydrocarbons, particularly hydrocarbons containing no chlorine atom are preferable, and above all, hydrocarbons containing no halogen atom are preferable. Specific examples of the solvents include acyclic or cyclic aliphatic hydrocarbon compounds and aromatic hydrocarbon compounds. The acyclic aliphatic hydrocarbon compounds are preferably those having not less than 5 and not more than 10 carbon atoms, and particularly preferred examples thereof include pentane (relative dielectric constant 1.8371), n-hexane (relative dielectric constant 1.8865), n-heptane (relative dielectric constant 1.5209), n-octane (relative dielectric constant 1.948), n-nonane (relative dielectric constant 1.9722) and n-decane (relative dielectric constant 1.5853). The cyclic aliphatic hydrocarbon compounds are preferably those having not less than 5 and not more than 8 carbon atoms, and particularly preferred examples thereof include cyclohexane (relative dielectric constant 2.0243) and cyclopentane (relative dielectric constant 1.9687). The aromatic hydrocarbon compounds are preferably those having not less than 6 and not more than 10 carbon atoms, and particularly preferred examples thereof include benzene (relative dielectric constant 2.2825), toluene (relative dielectric constant 2.379) and p-xylene (relative dielectric constant 2.2735).

The lower limit of the relative dielectric constant of the solvent is preferably not less than 0.5 because the reaction due to the aforesaid reaction formula easily proceeds, and it is more preferably not less than 1. The upper limit thereof is more preferably not more than 3.5, and still more preferably not more than 3.

In order to easily remove the solvent from the desired product in the second step and the third step described later, the boiling point of the solvent is preferably not higher than 200° C., and more preferably not lower than 40° C. and not higher than 120° C.

The process for preparing a mixed solution of the solvent, the basic compound and the silylating agent is not limited, and the three materials may be introduced into a reaction vessel at the same time, or after any one or two of them are introduced, the remainder may be introduced. It is preferable to mix the silylating agent and the basic compound with the solvent having been introduced in advance because miscibility of the silylating agent with the basic compound is easily enhanced.

It is preferable to dehydrate the solvent before use because decomposition of a silyl phosphine compound due to reaction with water and formation of impurities caused by the decomposition are prevented. The water content in the solvent is preferably not more than 20 ppm by mass, and more preferably not more than 10 ppm by mass. The water content can be measured by the method described in the Examples described later. It is also preferable to deaerate the solvent to remove oxygen before use. The deaeration can be carried out by an arbitrary method such as replacement with an inert atmosphere in the reactor.

The amount of the solvent is not limited, and is preferably, for example, not less than 100 parts by mass and not more than 300 parts by mass, particularly not less than 120 parts by mass and not more than 200 parts by mass, per 100 parts by mass of the silylating agent because the reaction proceeds efficiently.

As the phosphine to be mixed with the solvent, the basic compound and the silylating agent, one having an arsenic content of not more than 1 ppm by volume, preferably not more than 0.5 ppm by volume, in terms of arsine is used.

In general, examples of processes for producing phosphine include a process in which an alkali is allowed to act on white phosphorus, a process in which white phosphorus is subjected to hydrolysis or electrolytic reduction at a high temperature, and a process in which an acid or an alkali is allowed to act on a metallic phosphorus compound such as calcium phosphide. In these processes, white phosphorus is used as a starting raw material, and therefore, in phosphine, arsenic contained in white phosphorus is included in the form of arsine ($AsH_3$) in an amount of about 10 to 400 ppm.

For obtaining phosphine having an arsenic content of not more than 1 ppm by volume in terms of arsine, a method using activated carbon can be mentioned. For example, by introducing crude phosphine gas at a flow rate of 0.05 part by mass/hr to 3.5 parts by mass/hr per part by mass of activated carbon and at an introduction pressure of 0 to 6 MPa, phosphine gas having been reduced in an arsenic content to not more than 1 ppm by volume can be efficiently obtained. As the activated carbon, unused one or one having been used but regenerated by vacuum deaeration is used.

The method for measuring the amount of arsenic in phosphine is based on atomic absorption analysis, and the amount thereof can be determined by, for example, the method described in Examples described later. From the amount of arsenic (ratio of arsenic) in the phosphine gas determined by the atomic absorption analysis, an amount of arsenic (ratio of arsenic) by volume in terms of arsine is determined by calculation.

The purity of the phosphine gas used is preferably not less than 99.9995 vol %, more preferably not less than 99.9997 vol %, and particularly preferably not less than 99.9999 vol %.

The reaction system for the reaction of the silylating agent with the basic compound is preferably in an inert atmosphere because inclusion of oxygen is prevented, and formation of a compound represented by the formula (5) and a compound represented by the formula (6) due to the reaction of oxygen with the silyl phosphine compound is prevented. Examples of the inert gases include rare gases, such as nitrogen gas, helium gas and argon gas.

When the phosphine is introduced, the liquid temperature of the mixed solution is preferably not lower than 20° C. from the viewpoint of enhancement in reaction rate and yield, and is preferably not higher than 85° C. from the viewpoint of prevention of decomposition of the desired product. From these viewpoints, the liquid temperature of the mixed solution is more preferably not lower than 25° C. and not higher than 70° C.

It is preferable to subject the resulting solution to aging before the solution is subjected to solvent removal in the second step. This aging is preferably carried out at a temperature of not lower than 20° C. and not higher than 60° C., and more preferably at a temperature of not lower than 20° C. and not higher than 50° C., from the viewpoint of enhancement in reaction rate and yield. The time for aging is preferably not shorter than 1 hour and not longer than 48 hours, and more preferably not shorter than 2 hours and not longer than 24 hours. This aging is preferably carried out in an inert atmosphere.

Through the above first step, a solution containing a silyl phosphine compound is obtained.

Further, a second step of removing (separating) at least a part of the solvent from the solution containing a silyl phosphine compound to obtain a concentrated solution of the silyl phosphine compound of the formula (1) is carried out. By removing the solvent through concentration in the second step before distillation as described above, the amount of the solvent distillated away in the third step described later is reduced, so that a decrease in the yield of the silyl phosphine compound accompanying the solvent distillation during the distillation can be prevented, and thermal alteration or decomposition of the silyl phosphine compound of the formula (1) that is a desired product can be prevented.

After the first step, preferably after the aforesaid aging treatment, a treatment to remove a salt $HB_A^+X^-$ that is a by-product is preferably carried out prior to the second step.

Specifically, by allowing the solution containing the silyl phosphine compound of the formula (1) obtained in the first step (preferably the step including the aforesaid aging treatment) to stand still, a layer containing the silyl phosphine compound of the formula (1) and a layer containing $HB_A^+X^-$ are separated from each other, and the latter is removed by liquid separation, whereby $HB_A^+X^-$ can be removed. The time for standing is preferably not shorter than 0.5 hours and not longer than 48 hours, and more preferably not shorter than 1 hour and not longer than 24 hours. The liquid separation is preferably carried out in an inert atmosphere.

Second Step

The technique to remove the solvent in the second step is, for example, a technique of heating the solution containing the silyl phosphine compound of the formula (1) under reduced pressure and under the condition that the desired silyl phosphine compound almost remains, to evaporate the solvent. This treatment can be carried out by an arbitrary distillator for removing a solvent, such as a rotary evaporator. When the solution containing the silyl phosphine compound of the formula (1) is heated under reduced pressure in the second step, the maximum liquid temperature is preferably not lower than 20° C. and not higher than 140° C., and more preferably not lower than 25° C. and not higher than 90° C., from the viewpoint of efficient solvent removal and the viewpoint of prevention of decomposition or alteration of the silyl phosphine compound. From the same viewpoints, the pressure (minimum pressure) at the time of reduced pressure is preferably not less than 2 kPa and not more than 20 kPa, and more preferably not less than 5 kPa and not more than 10 kPa, in terms of absolute pressure. The concentration is preferably carried out in an inert atmosphere.

After the second step, the amount of the silyl phosphine compound in the solution containing a silyl phosphine compound is preferably not more than 5 mass % in terms of a decrease ratio to the amount of a silyl phosphine compound in the solution at the beginning of the second step. This amount can be measured by $^{31}$P-NMR. The mass of the concentrated solution obtained in the second step is preferably not less than 10% of the mass of the solution containing a silyl phosphine compound obtained in the first step from the viewpoint of enhancement in yield, and is preferably not more than 50% from the viewpoint that the amount of the solvent remaining in the next third step is reduced to thereby enhance purity.

Third Step

Subsequently, a third step of distilling the concentrated solution obtained in the second step is carried out. The conditions for the distillation are conditions under which the silyl phosphine compound vaporizes, and from the viewpoint of excellent separability of the desired compound, the distillation temperature (column top temperature) is preferably not lower than 50° C. From the viewpoint of suppression of decomposition or quality maintenance of the desired compound, the distillation temperature is preferably not higher than 150° C. From these viewpoints, the distillation temperature is preferably not lower than 50° C. and not higher than 150° C., and more preferably not lower than 70° C. and not higher than 120° C.

The pressure during the distillation is preferably not less than 0.01 kPa in terms of absolute pressure because a desired compound of high purity can be efficiently recovered. The pressure during the distillation is preferably not more than 5 kPa in terms of absolute pressure because decomposition or alteration of the silyl phosphine compound can be suppressed and the silyl phosphine compound is easily obtained with high purity in high yield. From these reasons, the pressure during the distillation is preferably not less than 0.01 kPa and not more than 5 kPa, and more preferably not less than 0.1 kPa and not more than 4 kPa. The distillation is preferably carried out in an inert atmosphere.

In a first fraction, the solvent, the basic compound, the silylating agent, a slight amount of a decomposition product of each component, etc. are contained, and therefore, by removing them, the purity can be enhanced.

After the third step, the amount of the silyl phosphine compound in the distillation residue after vaporization of the silyl phosphine compound is preferably not less than 90 mass % in terms of a decrease ratio to the amount of the silyl phosphine compound in the solution containing a silyl phosphine compound at the beginning of the third step. This amount can be measured by $^{31}$P-NMR.

Through the above third step, the desired silyl phosphine compound of the formula (1) is obtained. The resulting silyl phosphine compound is stored in the form of a liquid or a solid in an environment where contact with oxygen, water and the like is eliminated as much as possible, or is stored in the form of a dispersion of the compound in an appropriate solvent. In dispersions, solutions are included.

The solvent for dispersing the silyl phosphine compound is an organic solvent, and it is preferable that the solvent be particularly a non-polar solvent because inclusion of water is inhibited to prevent decomposition of the silyl phosphine compound. Examples of the non-polar solvents include saturated aliphatic hydrocarbons, unsaturated aliphatic hydrocarbons, aromatic hydrocarbon compounds, and trialkylphosphines. Examples of the saturated aliphatic hydrocarbons include n-hexane, n-heptane, n-octane, n-nonane, n-decane, n-dodecane, n-hexaclecane and n-octadecane. Examples of the unsaturated aliphatic hydrocarbons include 1-undecene, 1-dodecene, 1-hexadecene and 1-octadecene. Examples of the aromatic hydrocarbons include benzene, toluene, xylene and styrene. Examples of the trialkylphosphines include triethylphosphine, tributylphosphine, tridecylphosphine, trihexylphosphine, trioctylphosphine, and tridodecylphosphine. The boiling point of the organic solvent for dispersing the silyl phosphine compound is preferably high because handling of the silyl phosphine compound having spontaneous ignition properties, such as storage and transportation, can be safely carried out. The boiling point of the organic solvent is preferably not lower than 50° C., and more preferably not lower than 60° C. The upper limit of the boiling point of the organic solvent is preferably not higher than 270° C. (absolute pressure 0.1 kPa) from the viewpoint of influence on the properties of organic synthetic products and quantum dots produced using this as a raw material.

It is preferable to sufficiently dehydrate the solvent before the silyl phosphine compound is dispersed because decomposition of the silyl phosphine compound due to the reaction with water and formation of impurities due to the decomposition are prevented. The water content in the solvent is preferably not more than 20 ppm by mass, and more preferably not more than 10 ppm by mass. The water content can be measured by the method described in the Examples described later.

In order to prepare such conditions, for example, the solvent is deaerated and dehydrated while being heated under reduced pressure or vacuum conditions, thereafter the solvent is mixed with a silyl phosphine compound in a nitrogen gas atmosphere, and the mixture is poured into an airtight container.

Through these treatments, a dispersion of a silyl phosphine compound having been sufficiently decreased in the amount of impurities can be easily obtained.

In the dispersion of a silyl phosphine compound, the ratio of the silyl phosphine compound is preferably not less than 3 mass % and not more than 50 mass %, and more preferably not less than 8 mass % and not more than 30 mass.

As described above, the silyl phosphine compound obtained by the production process of the present invention and the silyl phosphine compound of the present invention have a low arsenic content, are inhibited from inclusion of impurities as much as possible and are prevented from being colored and decomposed. Owing to this, when the silyl phosphine compound is used as a raw material for organic synthesis (e.g., production of phosphinine or the like) or for producing indium phosphide, evil influences, such as inhibition of production reaction, decrease in yield and lowering of properties of the resulting organic compound or indium phosphide, can be effectively prevented, and particularly, InP quantum dots with a high quantum yield can be obtained.

A preferred process for producing InP quantum dots in the present invention is, for example, a process for producing InP quantum dots from a phosphorus source and an indium source, wherein a silyl phosphine compound of the formula (1) having an arsenic content of not more than the aforesaid upper limit is used as the phosphorus source.

The indium source is preferably, for example, an indium organocarboxylate from the viewpoints of ease of obtaining InP nanocrystals, easy availability and control of particle diameter distribution, and for example, saturated aliphatic indium carboxylates, such as indium acetate, indium laurate, indium myristate, indium palmitate, indium formate, indium propionate, indium butyrate, indium valerate, indium caproate, indium enanthate, indium caprylate, indium pelargonate, indium caprate, indium laurate, indium myristate, indium palmitate, indium margarate, indium stearate, indium oleate and indium 2-ethylhexancate; and unsaturated indium carboxylates, such as indium oleate and indium linoleate, can be preferably used, and especially from the viewpoints of easy availability and control of particle diameter distribution, it is preferable to use at least one selected from the group consisting of indium acetate, indium laurate, indium myristate, indium palmitate, indium stearate and indium oleate. Particularly preferable are indium salts of long chain fatty acids having not less than 12 and not more than 18 carbon atoms.

When quantum dots of a composite compound containing an element M other than phosphorus and indium are intended to be obtained, an element M source is also contained in the reaction mixture in addition to the phosphorus source and the indium source. In the case of, for example, a metallic element, such an element M source is preferably added not only in the form of an organocarboxyiic acid salt, particularly a salt of a long chain fatty acid having not less than 12 and not more than 18 carbon atoms, but also in the form of a chloride, a bromide or an iodide.

In the reaction mixture, the mole ratio between phosphorus and indium, P:In, is preferably 1:not less than 0.5 and not more than 10, and more preferably 1:not less than 1 and not more than 5, from the viewpoint of successfully obtaining quantum dots. When the element M is used, the P:M mole ratio in the reaction mixture is preferably 1:not less than 0.5 and not more than 10, and more preferably 1:not less than 1 and not more than 5.

The reaction of the phosphorus source with the indium source and the aforesaid element M source that is added when needed is preferably carried out in an organic solvent from the viewpoints of control of particle diameter, control of particle diameter distribution and enhancement of quantum yield. From the viewpoint of stability of the phosphorus source, the indium source, etc., the organic solvent is, for example, a nonpolar solvent, and from the viewpoints of control of particle diameter and enhancement of quantum yield, it is preferably, for example, an aliphatic hydrocarbon, an unsaturated aliphatic hydrocarbon, an aromatic hydrocarbon, a trialkylphosphine, or a trialkylphosphine oxide. Examples of the aliphatic hydrocarbon include n-hexane, n-heptane, n-octane, n-nonane, n-decane, n-dodecane, n-hexadecane and n-octadecane. Examples of the unsaturated aliphatic hydrocarbons include 1-undecene, 1-dodecene, 1-hexadecene and 1-octadecene. Examples of the aromatic hydrocarbons include benzene, toluene, xylene and styrene. Examples of the trialkylphosphines include triethylphosphine, tributylphosphine, tridecylphosphine, trihexylphosphine, trioctylphosphine and tridodecylphosphine. Example of the trialkylphosphine oxides include triethylphosphine oxide, tributylphosphine oxide, tridecylphosphine oxide, trihexylphosphine oxide, trioctylphosphine oxide and tridodecylphosphine oxide.

In the reaction solution in which the phosphorus source, the indium source and the aforesaid element M source that is added when needed have been mixed, the concentrations of the phosphorus source, the indium source and the M source are each preferably, for example, 0.1 mmol to 10 mmol per 100 g of the solution, from the viewpoint of control of particle diameter and the viewpoint of control of particle diameter distribution.

For mixing the phosphorus source, the indium source and the aforesaid element M source that is added when needed, it is preferable to dissolve each of the phosphorus source, the indium source and the element M source in an organic solvent and to mix the solution in which the phosphorus source has been dissolved in the organic solvent and the solution in which the indium source has been dissolved in the organic solvent, from the viewpoint that nanoparticles are easily formed. When the element M source is used, this source can be dissolved together with the indium source in one solution. The solvent for dissolving the phosphorus source and the solvent for dissolving the indium source may be the same as each other or may be different from each other.

The solution in which the phosphorus source has been dissolved in the organic solvent and the solution in which the indium source has been dissolved in the organic solvent may be each preliminarily heated to a preferred reaction temperature described later or a temperature lower or higher than the reaction temperature before mixing, or may be heated to a preferred reaction temperature described later after mixing.

For example, when quantum dots in which in addition to InP or a composite compound of In, P and an element M, a semiconductor compound material of another group III metal and phosphorus has been mixed are intended to be obtained, a solution of a mixture of an indium source and another quantum dot raw material is prepared before mixing of the indium source and the phosphorus source, and this solution is mixed with a solution containing the phosphorus source, whereby InP or a composite compound of In, P and an element M, and a semiconductor compound material of another III group metal and phosphorus may be formed at the same time. Examples of the group III metal sources include chlorides, bromides, iodides, and long chain fatty acid salts of group III metals.

It is preferable that after mixing, the phosphorus source, the indium source, and if necessary, the element M source be allowed to react with one another by maintaining the temperature at a prescribed temperature, and from the viewpoints of control of particle diameter and control of particle diameter distribution, the reaction temperature is preferably not lower than 250° C. and not higher than 350° C., and more preferably not lower than 270° C. and not higher than 330° C. From the viewpoints of control of particle diameter and control of particle diameter distribution, the reaction time is preferably not less than 1 minute and not more than 180 minutes, and more preferably not less than 2 minutes and not more than 60 minutes.

Through the above step, a reaction liquid containing an InP quantum dot material is obtained.

In the case where the InP quantum dots are each allowed to have a core-shell structure in which a core is formed of the InP quantum dot material and this core is coated with a coating compound, the method for forming the coating is, for example, a method including mixing the above-described reaction liquid containing an InP quantum dot material and a coating compound raw material and allowing them to react with each other at a temperature of not lower than 200° C. and not higher than 330° C. In this case, it is preferable to heat the reaction liquid containing an InP quantum dot material in advance to not lower than 150° C. and not higher than 350° C. preferably not lower than 200° C. and not higher than 330° C. Alternatively, by heating a part of the coating compound (e.g., source of metal such as Zn) to the same temperature and then adding and mixing this with the reaction liquid containing an InP quantum dot material before or after the addition of the other coating compound, the reaction liquid containing an InP quantum dot material may be heated.

In the case of a metal such as Zn, it is preferable to use, as the coating compound raw material, an organocarboxylic acid salt of the metal, particularly a salt of a long chain fatty acid having not less than 12 and not more than 18 carbon atoms, from the viewpoints of control of particle diameter, control of particle diameter distribution, and enhancement of quantum yield. The sulfur source is preferably, for example, a long chain alkanethiol having not less than 8 and not more than 18 carbon atoms, such as dodecanethiol, and the selenium source is, for example, a trialkylphosphine selenide compound having not less than 4 and not more than 12 carbon atoms, such as trioctylphosphine selenide. These coating compound raw materials may be mixed, as they are, with the reaction liquid containing an InP quantum dot material, or may be dissolved in a solvent in advance and then mixed with the reaction liquid containing an InP quantum dot material. When they are dissolved in a solvent in advance and then mixed, the same solvent as used for the reaction liquid of the phosphorus source, the indium source and the aforesaid element M source that is added when needed can be used as the solvent. The solvent for dissolving the coating compound raw material and the solvent, in the reaction liquid containing an InP quantum dot material may be the same as each other or may be different from each other. For example, when a metal such as zinc is used as the coating compound, the amount of the coating compound raw material used is preferably 0.5 to 50 mol, and more preferably 1 to 10 mol, per mol of indium in the reaction liquid containing an InP quantum dot material. In the case of the sulfur source or the selenium source, it is preferable to use an amount corresponding to the above-described amount of the metal.

The InP quantum dots obtained by the above process is excellent in quantum yield because a phosphorus source having been sufficiently reduced in the amount of arsenic is used, and they can be preferably used for a single-electron transistor, a security ink, quantum teleportation, laser, a solar cell, a quantum computer, a biomarker, a light-emitting diode, a backlight for display and a color filter.

EXAMPLES

The present invention is described below in more detail with reference to Examples, but the present invention is not limited to those Examples. In the following, a solvent having been reduced in water content to not more than 10 ppm by mass was used as each solvent. The water content was measured using a Karl Fischer Moisture Titrator (MKC-610 manufactured by Kyoto Electronics Manufacturing Co., Ltd.).

Example 1

A reaction vessel was charged with 189.8 kg of toluene, and then charged with 82 kg of triethylamine and 149.5 kg of trimethylsilyl trifluoromethanesulfonate, and the reaction vessel was purged with nitrogen, followed by adjusting the liquid temperature to 30° C.

An adsorption tower in which a stainless-steel pressure-resistant column having an inner diameter of 25 cm and a length of 2 m had been packed with 8.5 kg of granular activated carbon (manufactured by TSURUMI COAL CO., LTD.) was prepared. Into this adsorption tower, 7.5 kg of crude phosphine gas (manufactured by NIPPON CHEMI- CAL INDUSTRIAL CO., LTD.) having an arsenic content shown in Table 1 was introduced under the conditions of a flow rate of 750 g/hr and an introduction pressure of 2 MPa, thereby obtaining high-purity phosphine gas (purity: 99.9999 vol %) having been reduced in the arsenic content down to a content shown in Table 1 (the value shown in Table 1 is a volume-based value in terms of arsine).

A reaction vessel was charged with 7.4 kg of the resulting high-purity phosphine gas over a period of 3 hours, and the liquid temperature was adjusted to 35° C., followed by carrying out aging for 4 hours.

The resulting reaction solution of 424.9 kg had separated into two layers, and after they were allowed to stand still for 12 hours in order to use the upper layer, the lower layer was separated. In order to remove a low-boiling component, the upper layer was concentrated by a concentration can under reduced pressure until the final pressure became 6.3 kPa in terms of absolute pressure and the liquid temperature became 70° C., thereby obtaining 60.1 kg of a concentrated solution. A decrease ratio of the amount of the silyl phosphine compound in the solution containing a silyl phosphine compound after the second step to the amount of the silyl phosphine compound in the solution at the beginning of the second step was 3.2 mass %.

The resulting concentrated solution was distilled at a column top temperature of 85° C. under reduced pressure of 0.5 kPa, then a first fraction was removed, and thereafter, 45.1 kg of a main fraction was recovered, thereby obtaining a recovered substance. After the third step, the amount of the silyl phosphine compound in the distillation residue after vaporization of the silyl phosphine compound was 93 mass % in terms of a decrease ratio to the amount of the silyl phosphine compound in the solution containing a silyl phosphine compound at the beginning of the third step.

By the analysis based on $^{31}$P-NMR under the following conditions, the recovered substance (liquid) was confirmed to be tris(trimethylsilyl)phosphine (TMSP), and its purity and yield were measured. The results are set forth in Table 2 described below.

Moreover, by the following analysis, an arsenic content in the tris(trimethylsilyl)phosphine was measured. The result is set forth in Table 2 described below. "ppm" shown in Table 2 is mass-based one.

When the content of the aforesaid compound represented by the formula (2) in the tris(trimethylsilyl)phosphine was measured by the analysis based on $^{31}$P-NMR, it was 0.15 mol %; when the content of the aforesaid compound represented by the formula (3) was measured, it was less than 0.05 mol % (not more than the detection limit); when the content of the compound represented by the formula (5) was measured, it was less than 0.05 mol % (not more than the detection limit); when the content of the compound represented by the formula (6) was measured, it was less than 0.05 mol % (not more than the detection limit); and when the content of the compound represented by the formula (7) was measured, it was 0.10 mol %.

In addition, when the content of the compound represented by the formula (4) (R is methyl) in the tris(trimethylsilyl)phosphine was measured by gas chromatography analysis, it was 0.08 mol %.

Measuring Method for an Amount of Arsenic in Phosphine Gas

As an atomic absorption spectrometer, VARIAN-AA240 (manufactured by Agilent Technologies, Inc.) was used. As a standard solution used for a calibration curve, a standard solution for arsenic standard solution atomic absorption spectrometry (manufactured by Wako Pure Chemical Industries, Ltd., 1000 ppm) was used. As a sample, 100 ml of phosphine gas was allowed to be completely absorbed by 50 ml of a 1N potassium permanganate aqueous solution, and the resulting absorption solution was analyzed by an atomic absorption spectrometry absolute calibration curve method for the amount of arsenic. From the measured amount of arsenic, the number of moles of arsine was calculated, and a volume-based concentration in terms of arsine in phosphine was calculated.

Measuring Method for an Amount of Arsenic in Silyl Phosphine Compound Represented by Formula (1)

Measurement was carried out using an ICP-MS absolute calibration curve method. As an ICP-MS apparatus, Agilent 7500CS model (manufactured by Agilent Technologies, Inc.) was used, and as a standard solution used for a calibration curve, CertiPrep XSTC-13 manufactured by the same company was used. As a sample, 2.5 g of the silyl phosphine compound was diluted with 57.5 g of diethylene glycol dimethyl ether, it was further diluted 100 times, the resulting dilute solution was analyzed as a sample solution, and from the calibration curve, the amount of arsenic was calculated.

Measuring Method for Purity of Phosphine

A numerical value obtained by subtracting the aforesaid amount of arsenic in the phosphine gas and analytical values of impurity gas components ($H_2$, Ar, $N_2$, CO, $CO_2$, $CH_4$, $C_2H_6$, etc.) analyzed by gas chromatography (manufactured by Shimadzu Corporation, GC-7A) was taken as a purity of phosphine.

Measurement Conditions for Gas Chromatography

A measurement sample was subdivided into containers with septum caps in an inert gas atmosphere, and 0.2 μL of the measurement sample was injected into a gas chromatography (manufactured by Shimadzu Corporation, "GC-7A") by a syringe, followed by measurement under the following conditions.
Column: Porapak T 50-80 mesh (manufactured by GL Sciences Inc.)
Column temperature: 60° C.
Detector: TCD, carrier gas: He (100 kPa pressure)

Measuring Method for Amounts of tris(trimethylsilyl)phosphine and Compounds Represented by Formulas (2), (3), (5), (6) and (7)

Peak areas derived from tris(trimethyisilyl)phosphine (formula (1)) and the compounds represented by the formulas (2), (3), (5), (6) and (7) (R is methyl) were determined by $^{31}$P-NMR. The amount of each compound was determined by an area normalization method in which the total area of the detected peaks was taken as 100% and a ratio of each peak to that was calculated.

Measurement Conditions for $^{31}$P-NMR

A sample to be measured was dissolved in deuterated benzene in such a manner that the concentration became 20 mass %. The resulting solution was measured by JNM-ECA500 manufactured by JEOL Ltd. under the following conditions.

Observation frequency: 202.4 MHz, pulse: 45 degrees, capture time: 5 seconds, cumulative number of times: 256 times, measuring temperature: 22° C., standard substance: 85 mass % phosphoric acid Measuring Method for Amount of Compound Represented by Formula (4)

A peak area derived from the compound represented by the formula (4) (R is methyl) was determined by gas chromatography. The amount of the compound was determined by an area normalization method in which the total area of the detected peaks was taken as 100% and a ratio of the peak to that was calculated.

Measurement Conditions for Gas Chromatography

A measurement sample was subdivided into containers with septum caps in an inert gas atmosphere, and 0.2 μL of the measurement sample was injected into a gas chromatography (manufactured by Shimadzu Corporation, "GC-2010") by a syringe, followed by measurement under the following conditions.
Column: manufactured by Agilent J&W, "DB1" (inner diameter 0.25 mm, length 30 m), injection temperature: 250° C., detector temperature: 300° C.
Detector: FID, carrier gas: He (100 kPa pressure)
Split ratio: 1:100
Temperature rise conditions: maintenance of 50° C.×3 minutes→heating up to 200° C. at heating rate of 10° C./min→heating up to 300° C. at heating rate of 50° C./min→maintenance of 300° C.×10 minutes

TABLE 1

| Arsenic content before purification (ppm) | Arsenic content after purification (ppm) |
|---|---|
| 93 | 0.5 |

Comparative Example 1

As phosphine gas, unpurified phosphine gas before being reduced in an arsenic content was used. Tris(trimethylsilyl)phosphine was obtained in the same manner as in Example 1 except for that point. Purity, yield and arsenic content of the resulting tris(trimethylsilyl)phosphine are set forth in Table 2.

TABLE 2

| | Purity (mol %) | Yield (mass %) | Amount of arsenic (ppm) |
|---|---|---|---|
| Ex. 1 | 99.7 | 90 | N.D. |
| Comp. Ex. 1 | 99.1 | 90 | 25 |

N.D. . . . not more than detection limit (detection limit: less than 0.4 ppm)

In Examples 2 to 4 and Comparative Examples 2 to 4 described below, treatments relating to the synthesis of quantum dots, the measurement of UV-VIS spectrum, and the measurement of maximum fluorescence wavelength/quantum yield were each carried out in a nitrogen gas atmosphere.

Example 2

Synthesis of InP Quantum Dots

To 17.8 g of 1-octadecene, 0.375 mmol of indium myristate was added, and under reduced pressure, they were heated to 120° C. while stirring and deaerated for 90 minutes. After the deaeration, the resulting mixture was cooled down to 70° C. to obtain a 1-octadecene solution of indium myristate. Separately from this, 0.25 mmol of tris(trimethylsilyl)phosphine (TMSP) obtained in Example 1 was added to 0.6 g of 1-octadecene to obtain a 1-octadecene solution of TMSP. The resulting 1-octadecene solution of TMSP was heated up to 70° C. and then added to the 1-octadecene solution of indium myristate, and they were heated up to 300° C. while stirring and then maintained for 2 minutes, thereby obtaining a red liquid containing InP quantum dots.

Synthesis of InP/SnSe/ZnS Quantum Dots

To 18.6 g of 1-octadecene, 4.5 mmol of zinc myristate was added, and under reduced pressure, they were heated to 120° C. while stirring and deaerated for 90 minutes to obtain a 1-octadecene solution of zinc myristate. Of the resulting 1-octadecene solution of zinc myristate, a 2.2 ml portion was heated to 260° C. and added to the liquid containing InP quantum dots. The resulting liquid was further heated and stirred at 300° C. for 10 minutes, then 0.75 mmol of trioctylphosphine selenide was added, and they were maintained at 300° C. or 15 minutes while stirring. The above-described zinc myristate solution of 2.2 ml was heated to 260° C. and added to the resulting liquid again, then they were stirred at 300° C. for 10 minutes, thereafter 0.75 mmol of trioctylphosphine selenide was added, and they were maintained at 300° C. for 15 minutes while stirring. The 1-octadecene solution of zinc myristate of 15.4 ml was heated to 300° C. and added to the resulting liquid, and they were cooled down to 210° C. and then stirred for 30 minutes. To the resulting liquid, 12.5 mmol of 1-dodecanethiol was further added, and they were heated to 260° C. and then maintained for 2 hours while stirring. After cooling down to room temperature, impurities were removed by centrifugation, thereby obtaining, as a supernatant liquid, a 1-octadecene dispersion of InP/ZnSe/ZnS quantum dots formed of cores of InP and shells of ZnSe and ZnS. To this dispersion, acetone was added, and they were stirred and then subjected to centrifugation to recover InP/ZnSe/ZnS quantum dots as sediments. The recovered InP/ZnSe/ZnS quantum dots were suspended in hexane, thereby obtaining a hexane dispersion of purified InP/ZnSe/ZnS quantum dots. A maximum fluorescence wavelength and a quantum yield of the resulting InP/ZnSe/ZnS quantum dots were measured by the following methods. The results are set forth in Table 3.

Maximum Fluorescence Wavelength

A maximum fluorescence wavelength of the resulting hexane dispersion was measured by a fluorospectrophotometer (manufactured by Hitachi High-Tech science Corporation, F-7000) under the measurement conditions of an excitation wavelength of 450 nm and a measurement wavelength of 400 to 800 nm.

Quantum Yield

A quantum yield of the resulting hexane dispersion was measured by an absolute PL quantum yield measuring device (manufactured by Hamamatsu Photonics K.K., C11347-01) under the measurement conditions of an excitation wavelength of 450 nm.

Comparative Example 2

InP/ZnSe/ZnS quantum dots were obtained in the same manner as in Example 2, except that TMSP obtained in Comparative Example 1 was used. A maximum fluorescence wavelength and a quantum yield of the resulting InP/ZnSe/ZnS quantum dots were measured. The results are set forth in Table 3.

Example 3

Synthesis of InZnP Quantum Dots

To 63.4 g of 1-octadecene, 2.4 mmol of indium myristate and 1.6 mmol of zinc myristate were added, and under reduced pressure, they were heated to 110° C. while stirring and deaerated for 50 minutes. After the deaeration, the resulting mixture was heated to 300° C. to obtain a 1-octadecene solution of indium myristate and zinc myristate. Separately from this, 1.0 mmol of tris(trimethylsilyl)phosphine (TMSP) obtained in Example 1 was added to 2.25 g of 1-octadecene to obtain a 1-octadecene solution of TMSP. The resulting 1-octadecene solution of TMSP (room temperature) was added to the 1-octadecene solution of indium myristate and zinc myristate, and they were maintained at 300° C. for 30 minutes while stirring, thereby obtaining a dark red liquid containing InZnP quantum dots.

Synthesis of InZnP/ZnSe/ZnS Quantum Dots

The liquid containing InZnP quantum dots was set to 220° C., and to the liquid, 22.0 mmol of trioctylphosphine selenide was added, followed by heating to 260° C. Separately from this, 12.0 mmol of zinc myristate was added to 49.2 g of 1-octadence to obtain a 1-octadecene solution of zinc myristate. A quarter of the resulting 1-octadecene solution of zinc myristate and 30.0 mmol of dodecanethiol were added to the liquid containing InZnP quantum dots, and they were maintained at 260° C. for 1 hour while stirring. Operations of adding a quarter of the above-described zinc myristate solution and 30.0 mmol of dodecanethiol to the resulting liquid and maintaining them at 260° C. for 1 hour while stirring were further repeated three times, followed by cooling down to room temperature. Thereafter, impurities were removed by centrifugation, thereby obtaining, as a supernatant liquid, a 1-octadecene dispersion of InZnP/ZnSe/ZnS quantum dots formed of cores of InZnP and shells of ZnSe/ZnS. To this dispersion, acetone was added, and they were stirred and then subjected to centrifugation to recover InZnP/ZnSe/ZnS quantum dots as sediments. The recovered InZnP/ZnSe/ZnS quantum dots were suspended in hexane, thereby obtaining a hexane dispersion of purified InZnP/ZnSe/ZnS quantum dots. A maximum fluorescence wavelength and a quantum yield of the resulting InZnP/ZnSe/ZnS quantum dots were measured. The results are set forth in Table 3.

Comparative Example 3

Operations were carried out in the same manner as in Example 3, except that TMSP obtained in Comparative Example 1 was used. A maximum fluorescence wavelength and a quantum yield of the resulting InZnP/ZnSe/ZnS quantum dots were measured. The results are set forth in Table 3.

Example 4

Synthesis of InZnP/GaP Quantum Dots

To 69.0 g of 1-octadecene, 1.5 mmol of indium myristate and 3.0 mmol of zinc myristate were added, and under reduced pressure, they were heated to 110° C. while stirring and deaerated for 90 minutes. After the deaeration, 0.4 mmol of gallium chloride was added at 100° C., and then the resulting mixture was heated to 300° C. to obtain a 1-octadecene solution of indium myristate, zinc myristate and gallium chloride. Separately from this, 1.0 mmol of tris (trimethylsilyl)phosphine (TMSP) obtained in Example 1 was added to 2.25 g of 1-octadecene to obtain a 1-octadecene solution of TMSP. The resulting 1-octadecene solution of TMSP was added to the 1-octadecene solution of indium myristate, zinc myristate and gallium chloride, and they were maintained at 300° C. for 20 minutes while stirring, thereby obtaining an orange liquid containing InZnP/GaP quantum dots.

Synthesis of InZnP/GaP/ZnS Quantum Dots

To 50.5 g of 1-octadecene, 9.0 mmol of zinc myristate was added, and under reduced pressure, they were heated to 120° C. while stirring and deaerated for 90 minutes to obtain a 1-octadecene solution of zinc myristate. To the liquid containing InZnP/Gap quantum dots having been set to 230° C., 16 ml of the resulting 1-octadecene solution of zinc myristate (120° C.) and 4.0 mmol of dodecanethiol were added, and they were maintained at 230° C. for 1 hour while stirring. Operations of adding 16 ml of the above-described zinc myristate solution and 4.0 mmol of dodecanethiol to the resulting liquid and maintaining them at 230° C. for 1 hour while stirring were further repeated four times, followed by cooling down to room temperature. Thereafter, impurities were removed by centrifugation, thereby obtaining, as a supernatant liquid, a 1-octadecene dispersion of InZnP/GaP/ZnS quantum dots formed of cores of InZnP/GaP and shells of ZnS. To this dispersion, acetone was added, and they were stirred and then subjected to centrifugation to recover InZnP/GaP/ZnS quantum dots as sediments. The recovered InZnP/GaP/ZnS quantum dots were suspended in hexane, thereby obtaining a hexane dispersion of purified InZnP/GaP/ZnS quantum dots. A maximum fluorescence wavelength and a quantum yield of the resulting InZnP/GaP/ZnS quantum dots were measured. The results are set forth in Table 3.

Comparative Example 4

Operations were carried out in the same manner as in Example 4, except that TMSP obtained in Comparative Example 1 was used. A maximum fluorescence wavelength and a quantum yield of the resulting InZnP/GaP/ZnS quantum dots were measured. The results are set forth in Table 3.

TABLE 3

| | Maximum fluorescence wavelength (nm) | Quantum yield (%) |
|---|---|---|
| Ex. 2 | 601 | 23 |
| Comp. Ex. 2 | 610 | 18 |
| Ex. 3 | 583 | 39 |
| Comp. Ex. 3 | 600 | 32 |
| Ex. 4 | 510 | 55 |
| Comp. Ex. 4 | 518 | 48 |

As is obvious from a comparison between Example 2 and Comparative Example 2, a comparison between Example 3 and Comparative Example 3, and a comparison between Example 4 and Comparative Example 4, by reducing an arsenic content in the silyl phosphine compound of the formula (1) for use in the production of InP quantum dots, the quantum yield of the resulting InP quantum dots has proved to be enhanced.

INDUSTRIAL APPLICABILITY

When the silyl phosphine compound of the present invention is used as a raw material for chemical synthesis of InP quantum dots, the quantum yield of the resulting InP quantum dots can be enhanced. In the process for producing a silyl phosphine compound of the present invention, a high-purity silyl phosphine compound that has a low arsenic content and is preferable as a raw material of InP quantum dots can be produced by an industrially advantageous process. The quantum yield of InP quantum dots obtained by the process for producing InP quantum dots of the present invention is high.

The invention claimed is:

1. A process for producing a composition comprising a silyl phosphine compound represented by the following formula (1), wherein an arsenic content is not more than 1 ppm by mass,

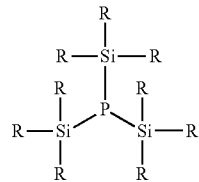

(1)

wherein each R is independently an alkyl group having not less than 1 and not more than 5 carbon atoms or an aryl group having not less than 6 and not more than 10 carbon atoms, wherein a content of at least one of compounds represented by the following formulas (2) to (7) as a ratio to a content of the compound represented by the formula (1) in the composition satisfies a corresponding one of the following requirements (a) to (f):

(a) the content of the compound represented by the following formula (2) is not more than 0.3 mol %,

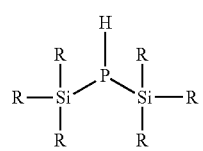

(2)

wherein R is the same as in the formula (1), (b) the content of the compound represented by the following formula (3) is not more than 0.1 mol %,

(3)

wherein R is the same as in the formula (1), (c) the content of the compound represented by the following formula (4) is not more than 0.50 mol %,

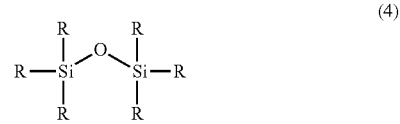

(4)

wherein R is the same as in the formula (1), (d) the content of the compound represented by the following formula (5) is not more than 0.30 mol %,

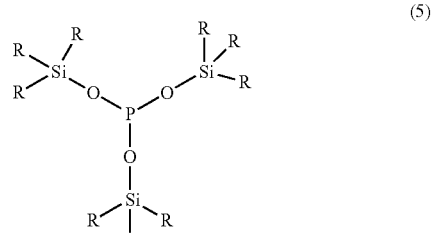

(5)

wherein R is the same as in the formula (1), (e) the content of the compound represented by the following formula (6) is not more than 0.30 mol %,

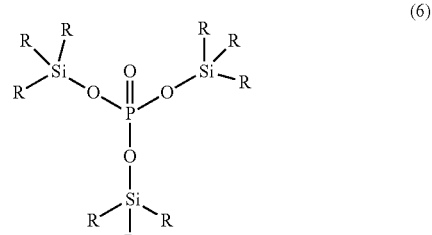

(6)

wherein R is the same as in the formula (1); and (f) the content of the compound represented by the following formula (7) is not more than 1.0 mol %,

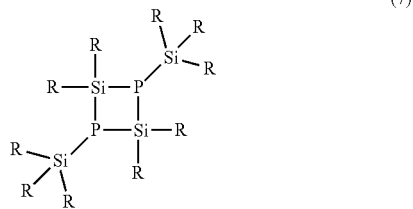

(7)

wherein R is the same as in the formula (1), the method comprising:

a first step of mixing a solvent which contains no halogen atom, a basic compound, a silylating agent represented by the following formula (I) and phosphine to obtain a solution containing a silyl phosphine compound;

a second step of removing the solvent from the solution containing a silyl phosphine compound to obtain a concentrated solution of a silyl phosphine compound under a reduced pressure of not less than 5 kPa and not more than 20 kPa in terms of absolute pressure; and a third step of distilling the concentrated solution of a silyl phosphine compound to obtain the silyl phosphine compound under a reduced pressure of not less than 0.01 kPa and not more than 4 kPa in terms of absolute pressure; wherein as the phosphine, phosphine having an arsenic content of not more than 1 ppm by volume in terms of arsine is used,

(I)

wherein each R is independently an alkyl group having not less than 1 and not more than 5 carbon atoms or an aryl group having not less than 6 and not more than 10 carbon atoms, and X is at least one group selected from a fluorosulfonic acid group, a fluoroalkanesulfonic acid group and a perchloric acid group.

2. The process for producing the silyl phosphine compound according to claim 1, wherein the basic compound is one or two or more selected from methylamine, dimethylamine, trimethylamine, ethylamine, diethylamine, triethylamine, ethylenediamine, aniline, toluidine, pyridine and piperidine.

3. The process for producing the silyl phosphine compound according to claim 1, wherein the silylating agent is one or two or more selected from trimethylsilyl trifluoromethanesulfonate, triethylsilyl trifluoromethanesulfonate, tributylsilyl trifluoromethanesulfonate, triisopropylsilyl trifluoromethanesulfonate, triphenylsilyl trifluoromethanesulfonate and tert-butyldimethylsilyl trifluoromethanesulfonate.

4. The process for producing a silyl phosphine compound according to claim 1, wherein the basic compound in an amount not less than 3 times and not more than 6 times the molar amount of phosphine is mixed with phosphine in the first step.

5. The process for producing a silyl phosphine compound according to claim 1, wherein the silylating agent in an amount not less than 3 times and not more than 6 times the molar amount of phosphine is mixed with phosphine in the first step.

6. The process for producing a silyl phosphine compound according to claim 1, wherein the silyl phosphine compound is tris(trimethylsilyl)phosphine.

7. The process for producing a silyl phosphine compound according to claim 1, wherein the first step is carried out in an inert atmosphere.

8. The process for producing a silyl phosphine compound according to claim 1, wherein the silyl phosphine compound obtained in the third step is mixed with an organic solvent having been dehydrated, to obtain a silyl phosphine compound in a state of being dispersed in the organic solvent.

* * * * *